(12) United States Patent
Choi et al.

(10) Patent No.: US 8,633,498 B2
(45) Date of Patent: Jan. 21, 2014

(54) DISPLAY SUBSTRATE AND METHOD OF MANUFACTURING THE SAME

(75) Inventors: Tae-Young Choi, Seoul (KR); Kang-Moon Jo, Seoul (KR); Bo-Sung Kim, Seoul (KR); Young-Min Kim, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 98 days.

(21) Appl. No.: 13/112,381

(22) Filed: May 20, 2011

(65) Prior Publication Data

US 2012/0138965 A1    Jun. 7, 2012

(30) Foreign Application Priority Data

Dec. 2, 2010    (KR) .................. 10-2010-0121868

(51) Int. Cl.
*H01L 29/18*    (2006.01)

(52) U.S. Cl.
USPC .............................................. 257/88; 257/81

(58) Field of Classification Search
USPC ....................................................... 257/88, 81
See application file for complete search history.

(56) References Cited

U.S. PATENT DOCUMENTS

2008/0001142 A1*    1/2008    Cho et al. ...................... 257/40

\* cited by examiner

*Primary Examiner* — Douglas Menz
(74) *Attorney, Agent, or Firm* — H.C. Park & Associates, PLC (57) ABSTRACT

A display substrate includes a base substrate, a data line, a gate line, a switching element, a self assembled monolayer (SAM) and a pixel electrode. The data line is formed on the base substrate. The gate line is formed across the data line. The switching element includes a source electrode electrically connected to the data line, a drain electrode spaced apart from the source electrode, a semiconductor pattern covering the source and drain electrodes, and a gate electrode electrically connected to the gate line and facing the semiconductor pattern. The SAM is disposed around the semiconductor pattern and a conductive pattern including the data line. The pixel electrode is electrically connected to the switching element.

10 Claims, 13 Drawing Sheets

DISPLAY SUBSTRATE AND METHOD OF MANUFACTURING THE SAME

PRIORITY STATEMENT

This application claims priority under 35 U.S.C. §119 to Korean Patent Application No. 2010-121868, filed on Dec. 2, 2010, which is hereby incorporated by reference for all purposes as if fully set forth herein.

BACKGROUND OF THE INVENTION

1. Field of the Invention

Exemplary embodiments of the present invention relate to a display substrate and a method of manufacturing the display substrate.

2. Description of the Related Art

Generally, a liquid crystal display (LCD) includes a display substrate (i.e., a thin film transistor (TFT) substrate), an opposite substrate, and a liquid crystal layer formed between the display substrate and the opposite substrate. A plurality of gate lines and a plurality of data lines are formed on the display substrate. A switching element and a pixel electrode are formed on the display substrate. The switching element is connected to the gate line and the data line, and the pixel electrode is connected to the switching element. The switching element includes a gate electrode extending from the gate line, a channel overlapping the gate electrode, a data electrode extending from the data line and electrically connected to the channel, and a drain electrode spaced apart from the data electrode and electrically connected to the channel.

In order to manufacture a display substrate, a plurality of masks is used. Recently, a manufacturing process decreasing the number of masks has been developed to decrease manufacturing time and cost prices.

Generally, in a five-mask process, a separate mask is used to form each of a gate line, a semiconductor pattern, a source pattern, a contact hole and a pixel electrode. In a four-mask process, one mask is used to form the semiconductor pattern and the source pattern.

However, in the four-mask process, since one mask is used to form the semiconductor pattern and the source pattern, the semiconductor pattern is formed below the source pattern. For example, the semiconductor pattern is formed below the data line, which is included in the source pattern. Thus, display defects may occur, such as a waterfall effect, due to a leakage current of the semiconductor pattern.

SUMMARY OF THE INVENTION

Exemplary embodiments of the present invention provide a display substrate that is formed through a simplified manufacturing process and that has improved product reliability.

Exemplary embodiments of the present invention also provide a method of manufacturing the display substrate.

A display substrate, according to an exemplary embodiment of the present invention, includes a base substrate, a data line, a gate line, a switching element, a self-assembled monolayer (SAM) and a pixel electrode. The data line is formed on the base substrate and extends in a first direction. The gate line is formed on the base substrate and extends in a second direction across the data line. The switching element includes a source electrode electrically connected to the data line, a drain electrode spaced apart from the source electrode, a semiconductor pattern covering the source and drain electrodes, and a gate electrode electrically connected to the gate line and facing the semiconductor pattern. The SAM is disposed in the area which surrounds the semiconductor pattern and a conductive pattern including the data line. The pixel electrode is electrically connected to the switching element.

A method for manufacturing a display substrate, according to another exemplary embodiment of the present invention, comprises forming a conductive layer on a base substrate. The conductive layer includes a first metal layer formed on the base substrate and a second metal layer formed on the first metal layer. First and second photo patterns are formed on the conductive layer. The second photo pattern is thinner than the first photo pattern. The conductive layer is patterned using the first and second photo patterns, to form a conductive pattern including a data line and a switching electrode. The first and second photo patterns are partially removed to form a third photo pattern in source and drain areas on the switching electrode. The second metal layer of the switching electrode is patterned using the third photo pattern. A SAM is formed on the base substrate, around the conductive pattern. The first metal layer of the switching electrode is patterned using the patterned second metal layer of the switching electrode as a mask, to form source and drain electrodes. A soluble semiconductor material is applied to the source and drain electrodes, to form a semiconductor pattern covering the source and drain electrodes. A pixel electrode electrically connected to the drain electrode is formed.

According to the present invention, a semiconductor pattern may be formed with a soluble semiconductor material without a mask, using the SAM, so that the display substrate having the switching element may be manufactured with a four-mask process.

Additional features of the invention will be set forth in the description which follows, and in part will be apparent from the description, or may be learned by practice of the invention. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 1:
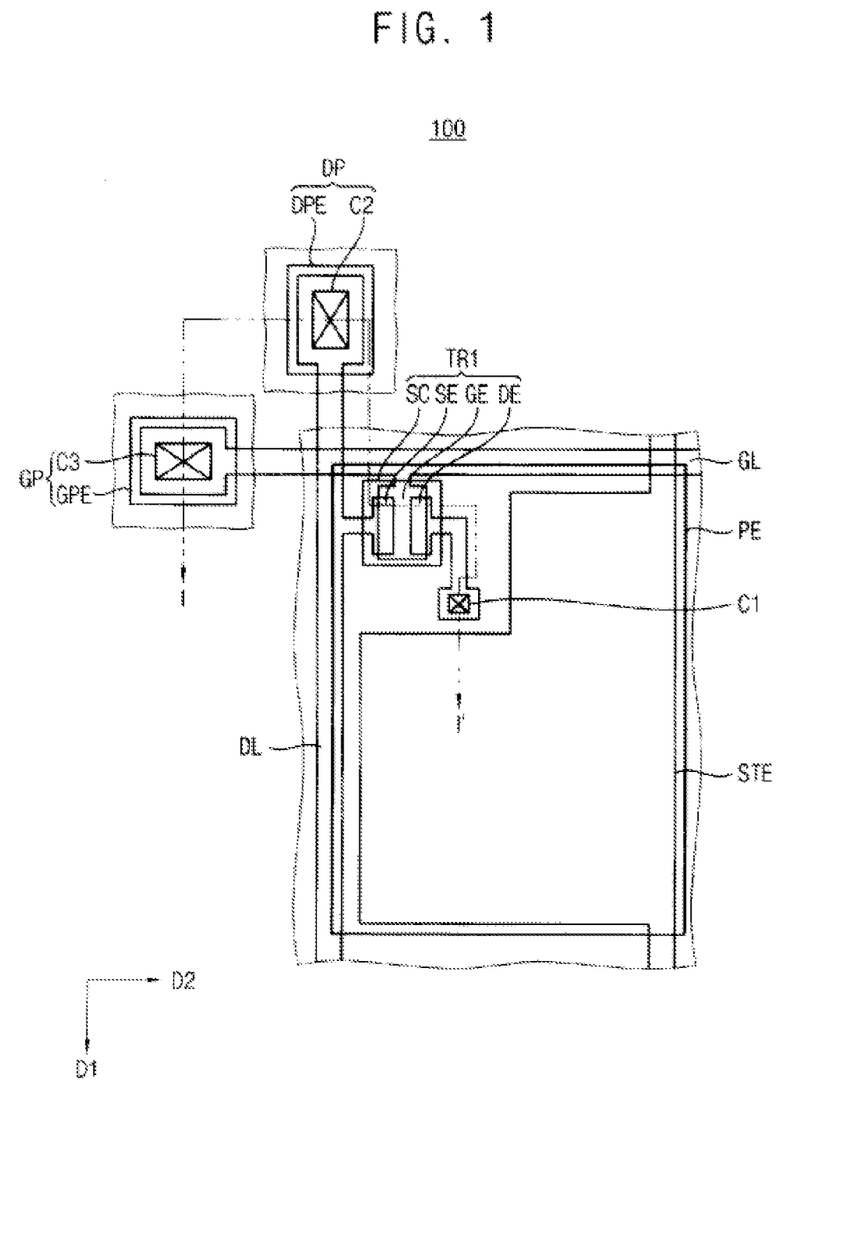
FIG. 1 is a plan view illustrating a display panel, according to an exemplary embodiment of the present invention.
Figure 2:
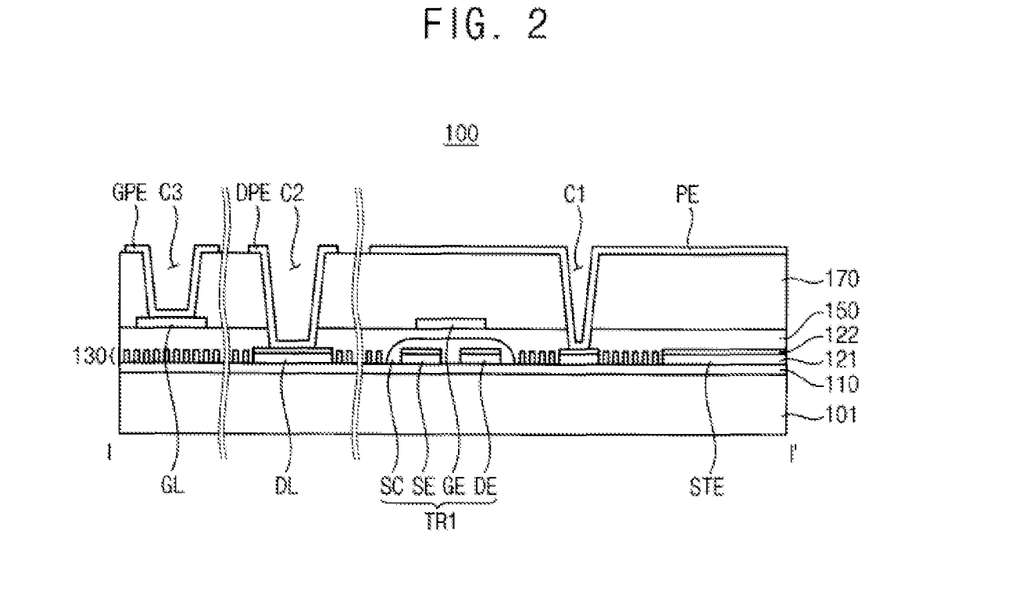
FIG. 2 is a cross-sectional view taken along line I-I' of FIG. 1.

FIG. 1 is a plan view illustrating a display panel, according to an exemplary embodiment of the present invention. FIG. 2 is a cross-sectional view illustrating a display substrate taken along line I-I' of FIG. 1.

Referring to FIGS. 1 and 2, the display substrate 100 includes base substrate 101, a gate line GL, a data line DL, a pixel electrode PE, a switching element TR1, a storage electrode STE, a data pad DP, and a gate pad GP. The display substrate 100 may further include an insulation layer 110, a self-assembled monolayer (SAM) 130, a gate insulation layer 150, and an organic insulation layer 170. The base substrate 101 may include a glass substrate or a flexible substrate.

The data line DL extends along a first direction D1. A plurality of the data lines DL may be disposed in parallel. The data lines DL may be referred to as a first conductive pattern. The first conductive pattern includes a first metal layer 121 and a second metal layer 122 formed on the first metal layer 121. Examples of a material that is used to form the first metal layer 121 may include at least one of chromium (Cr), a chromium alloy, molybdenum (Mo), molybdenum nitride (MoN), molybdenum niobium (MoNb), a molybdenum alloy, copper (Cu), a copper alloy, a copper molybdenum (CuMo) alloy, aluminum (Al), an aluminum alloy, silver (Ag), and a silver alloy, which have good wiring characteristics. The second metal layer 122 may include a metal material having a good contact resistance with a soluble semiconductor material mentioned below, for example, the second metal layer 122 may comprise indium tin oxide (ITO).

The gate line GL extends along the second direction D2, across the data line DL. A plurality of the gate lines GL may be disposed in parallel. The gate lines GL may be referred to as a second conductive pattern.

The pixel electrode PE may be referred to as a third conductive pattern. The pixel electrode PE may be formed of a transparent conductive material or an opaque conductive material. The pixel electrode PE is disposed on a pixel area on the base substrate 101. The pixel electrode PE may include the transparent conductive material when the display substrate is a transmissive-type. The pixel electrode PE may include the transparent conductive material or the opaque conductive material, according to the type of an electro-optical layer and when the display substrate is a reflective-type. Thus, the pixel electrode PE may include the transparent conductive material when the electro-optical layer is an electrophoretic layer including black and white conductive particles.

The switching element TR1 includes a source electrode SE, a drain electrode DE, a semiconductor pattern SC, and a gate electrode GE. The source electrode SE, which is included in the first conductive pattern, is connected to the data line DL. The drain electrode DE, which is included in the first conductive pattern, is connected to the pixel electrode PE through a first contact hole C1. The semiconductor pattern SC covers the source electrode SE and the drain electrode DE. The semiconductor pattern SC is formed from a soluble semiconductor material, using a self-assembly technique (SAT). Examples of the soluble semiconductor material may include a material formed from a single source material, such as, zinc oxide (ZnO), indium oxide ($InO_x$), tin oxide ($SnO_x$), gallium oxide ($GaO_x$), etc. The soluble semiconductor material may include a material formed from a mixture of two source materials, such as, zinc tin oxide (ZTO), indium zinc oxide (IZO), indium tin oxide (ITO), etc. According to some aspects, the soluble semiconductor material may include a material formed from a mixture of three source materials, such as, gallium indium zinc oxide (GIZO), xenon indium zinc oxide (XIZO), hafnium indium zinc oxide (HfIZO), etc. According to some aspects, the soluble semiconductor material may include a material formed from a mixture of four source materials, such as, gallium indium sulfur zinc oxide (GISZO), xenon gallium indium zinc oxide (XGIZO), etc.

The gate electrode GE, which is included in the second conductive pattern, is connected to the gate line GL and disposed on the semiconductor pattern SC. The switching element TR1 has a top-gate structure, but the present invention is not limited thereto. In the top-gate structure, the semiconductor pattern SC includes a back channel adjacent to the base substrate 101.

The storage electrode STE, which is included in the first conductive pattern, is disposed in the pixel area, so as to overlap with the pixel electrode PE. The data pad DP includes an end portion of the data line DL and a data pad electrode DPE connected to the end portion of the data line DL through a second contact hole C2. The gate pad GP includes an end portion of the gate line GL and a gate pad electrode GPE connected to the end portion of the gate line GL, through a third contact hole C3. The data pad electrode DPE, the gate pad electrode GPE, and the pixel electrode PE are included in the third conductive pattern.

The insulation layer 110 covers one side of the base substrate 101. The insulation layer 110 includes a material that provides a good interface between the semiconductor pattern SC and the base substrate 101, at a portion where the back channel of the semiconductor pattern SC is formed. The insulation layer 110 may include silicon oxide ($SiO_x$), for example.

The SAM 130 is disposed on the insulation layer 110, around the first conductive pattern (DL, SE, DE, and STE) and the semiconductor pattern SC. The SAM 130 is formed by the SAT.

The gate insulation layer 150 is disposed on the base substrate 101, so as to cover the first conductive pattern (DL, SE, DE, and STE) and the SAM 130. The organic insulation layer 170 is disposed on the base substrate 101, so as to cover the second conductive pattern (GL and GE). The organic insulation layer 170 may be formed as a relatively thick layer, to provide a high aperture ratio structure.

FIGS. 3A to 3E are cross-sectional views explaining a method of forming the first conductive pattern (DL, SE, DE, and STE) and the semiconductor pattern SC of FIG. 2. FIG. 4 is a plan view illustrating the display substrate on which the first conductive pattern and the semiconductor pattern SC are formed.

Figure 3A:
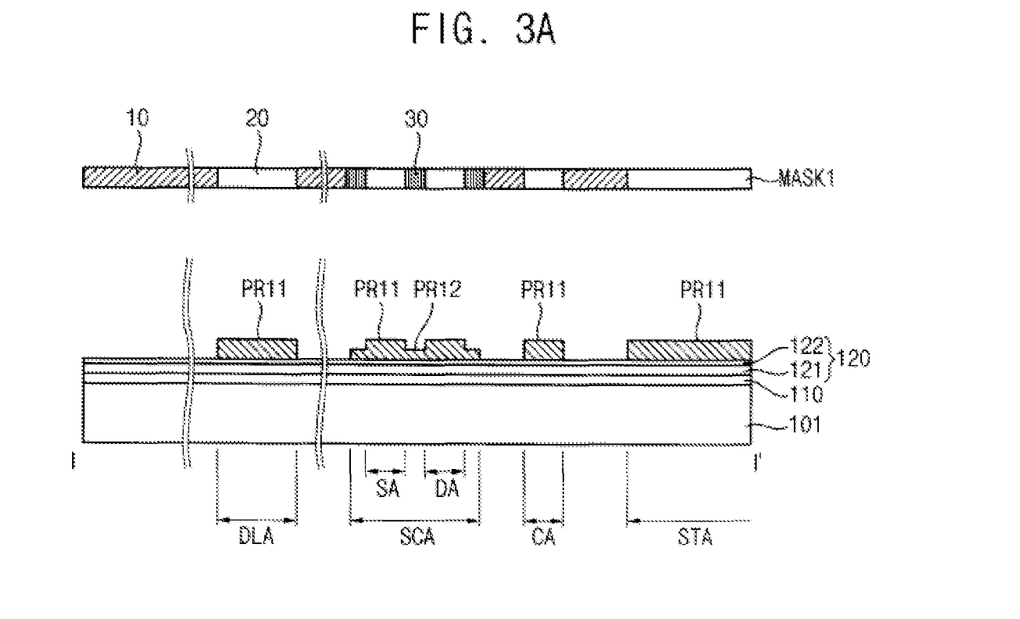
FIGS. 3A, 3B, 3C, 3D, and 3E are cross-sectional views explaining a method of forming a first conductive pattern and a semiconductor pattern of FIG. 2.
Figure 4:
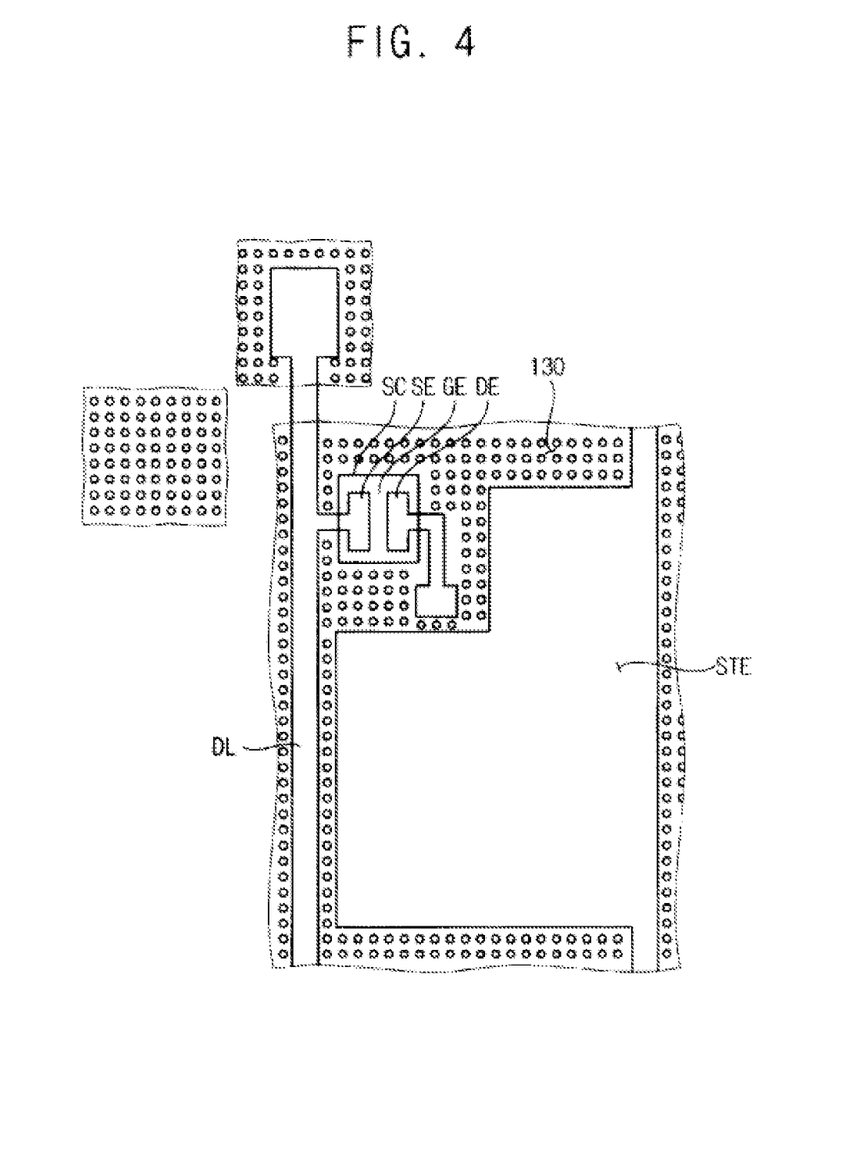
FIG. 4 is a plan view illustrating the conductive pattern and the semiconductor pattern of FIG. 2.

Referring to FIGS. 2 and 3A, the insulation layer 110 is formed on the base substrate 101. A first conductive layer 120 is formed on the insulation layer 110. The first conductive layer 120 includes the first and second metal layers 121 and 122.

A photoresist film is formed on the second metal layer 122. The photoresist film is patterned using a first mask MASK1. The first mask MASK1 includes a blocking portion 10, an open portion 20, and a slit portion 30. A first photo pattern PR11 having a first thickness is formed due to the open portion 20. A second photo pattern PR12 having a second thickness, which is thinner than the first thickness, is formed due to the slit portion 30. Alternatively, the first mask MASK1 may include a transflective portion the partially reflects and partially transmits the light, instead of the slit portion 30.

The first photo pattern PR11 is formed on a data line area DLA, in which the data line DL is formed, in a contact area CA, in which a contact electrode CE connected to the drain electrode DE is formed, and in a storage area STA, in which the storage electrode STE is formed. The first photo pattern PR11 and the second photo pattern PR12 are formed in a semiconductor area SCA, in which the semiconductor pattern SC is formed.

The first photo pattern PR11 is formed on source and drain areas SA and DA, in which the source and drain electrodes SE and DE are formed. The second photo pattern PR12 is formed on a portion of the semiconductor area SCA, but does not directly face the source and drain areas SA and DA. The first conductive layer 120 is patterned using the first and second photo patterns PR11 and PR12.

Figure 3B:
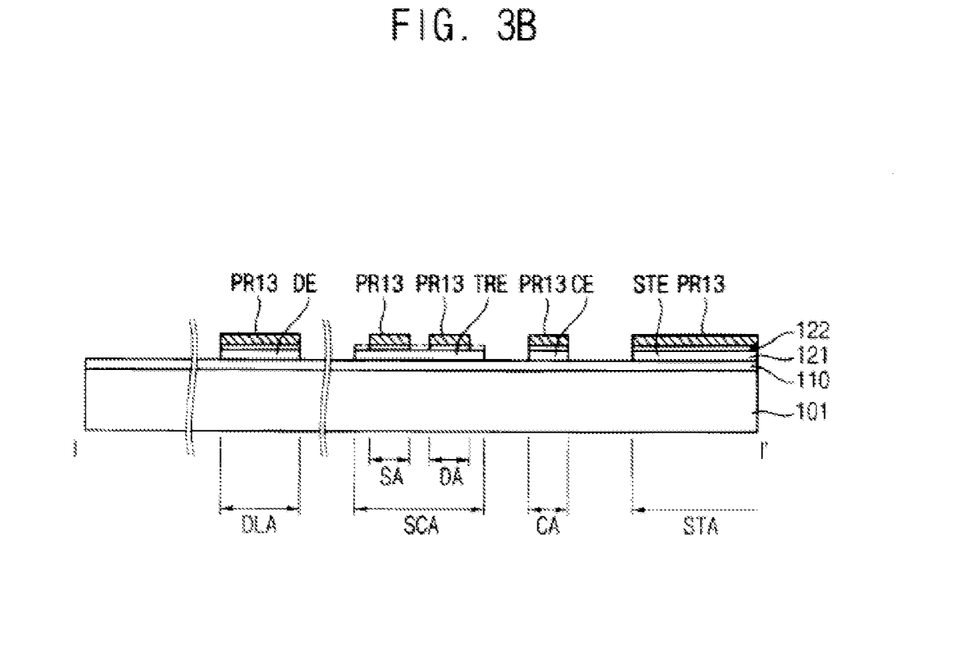

Referring to FIG. 3B, the patterning forms the data line DL, the contact electrode CE, and the storage electrode STE, and at least partially forms a switching electrode TRE. An etch back process is performed to remove the second photo pattern PR12 and reduce the thickness of the first photo pattern PR11. As such, the etch back process converts the second photo pattern PR 12 into a third photo pattern PR13 having a third thickness. The third photo pattern PR13 is formed on the data line area DLA, the source and drain areas SA and DA, the contact area CA, and the storage area STA. However, a second metal layer 122 is exposed by the third photo pattern PR13 in portions except for the source and drain areas SA and DA.

Then, the exposed portions of the second metal layer 122 are etched using the third photo pattern PR13. Accordingly, the switching electrode TRE is formed in the semiconductor area SCA.

Figure 3C:
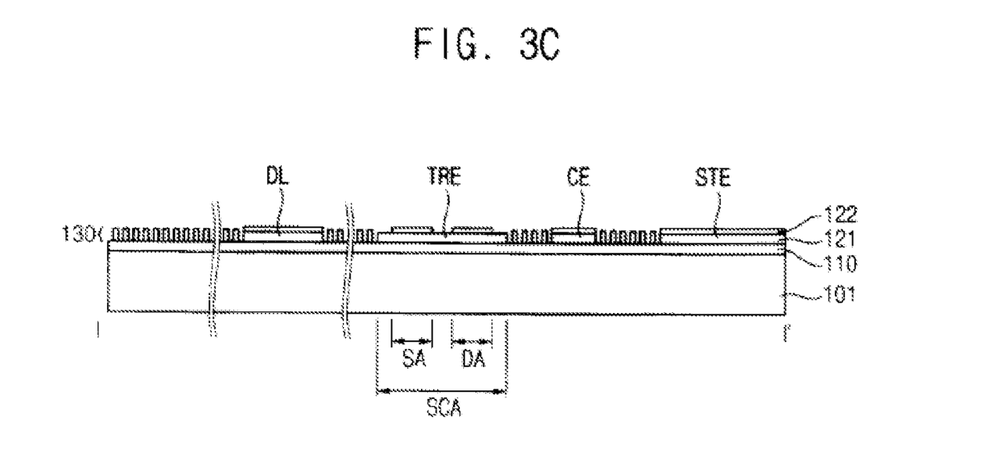

Referring to FIGS. 3C and 4, the SAM 130 is formed on the insulation layer 110, using the first conductive pattern (DL, SE, DE, and STE) as a mask (around the first conductive pattern). The SAM 130 is not formed on portions of the insulating layer 110 where the first conductive pattern is formed.

The SAM 130 is formed by a fluidic system and is capable of controlling interface characteristics of a metal, a metallic oxide, and/or a semiconductor. The SAM 130 is an organic assembly formed by absorbing organic molecules in a liquid or a gas phase. The SAM 130 is self-organized into a crystal structure. End portions of the SAM 130 may be modified by exposure to various elements, so as to improve the bonding of the SAM 130 to specific surfaces. The SAM 130 may be chemically bonded to an adjacent layer, such as the insulation layer 110, so as to form a strong molecular film.

The SAM 130 has a uniform thickness in the range of several nanometers. In addition, additional devices are not need to form the SAM 130, and a shape or a size of substrate has no effect on forming the SAM 130, so that the SAM 130 may be easily formed on a complex substrate or a large-sized substrate. The SAM 130 includes a head portion and a body portion. The head portion makes a chemical bond with the surface of the insulation layer 110. Example of a material that is used for the head portion may include chlorosilane, thiol, or alkanoic acid. The body portion includes an alkyl group ($[CH_2]_n$). For example, an aliphatic compound, an aromatic compound, or benzene may be formed at the end of the body portion.

The switching electrode TRE is patterned, using the second metal layer 122 in the source and drain areas SA and DA as a mask, to form the source and drain electrodes SE and DE of the switching element TR1. The source and drain electrodes SE and DE are formed in the source and drain areas SA and DA. In a remaining area of the semiconductor area SCA, the insulation layer 110 is exposed.

Figure 3D:
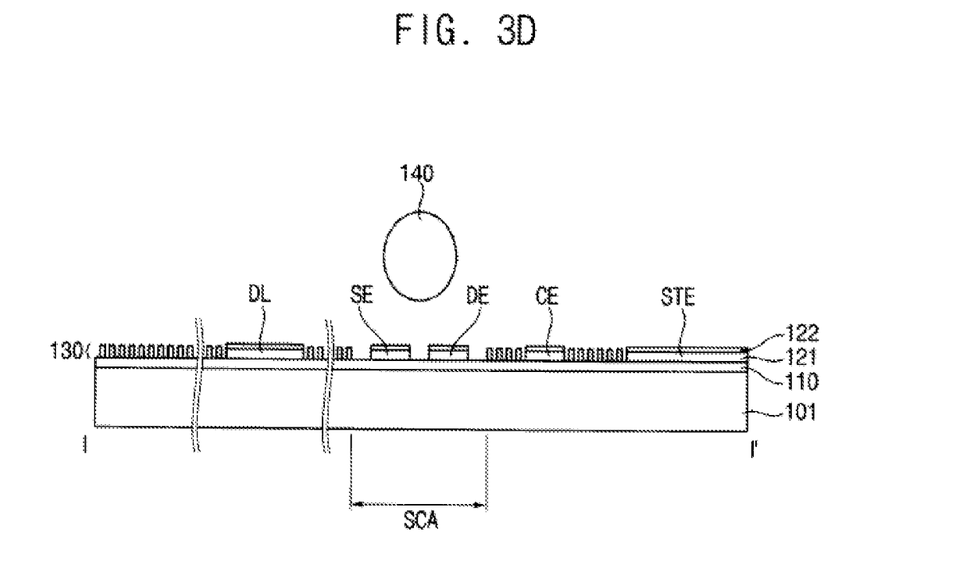

Referring to FIGS. 3D and 4, a soluble semiconductor material 140 is applied to the semiconductor area SCA, by an inkjet dropping method. The soluble semiconductor material 140 is condensed in the semiconductor area SCA, by the SAM 130 adjacent thereto, thereby forming the semiconductor pattern SC. Examples of the soluble semiconductor material are as discussed above.

The soluble semiconductor material 140 may include an oxide semiconductor material. The oxide semiconductor material may include an amorphous oxide including indium (In), zinc (Zn), and gallium (Ga), or an amorphous oxide including indium (In), zinc (Zn), and hafnium (Hf). The oxide semiconductor material may include an oxide material such as, indium zinc oxide (InZnO), indium gallium oxide (InGaO), indium tin oxide (InSnO), zinc tin oxide (ZnSnO), gallium tin oxide (GaSnO), gallium zinc oxide (GaZnO), and the like. A Group III, IV, or V element or a transition element may be further included in the oxide semiconductor material.

The effective mobility of an electric charge the oxide semiconductor material is about 2 to 100 times larger than that of hydrogenated amorphous silicon, and the oxide semiconductor material has an on-off current ratio of about 10:5 to 10:8. As such, the semiconductor pattern SC including the oxide semiconductor material has good semiconductor characteristics. In addition, in the oxide semiconductor pattern SC, a band gap is about 3.0 eV to 3.5 eV, so that a photocurrent may be prevented from leaking, with respect to visible rays. Thus, a light blocking layer may be omitted from under the switching element TR1, thereby improving an aperture ratio.

Figure 3E:
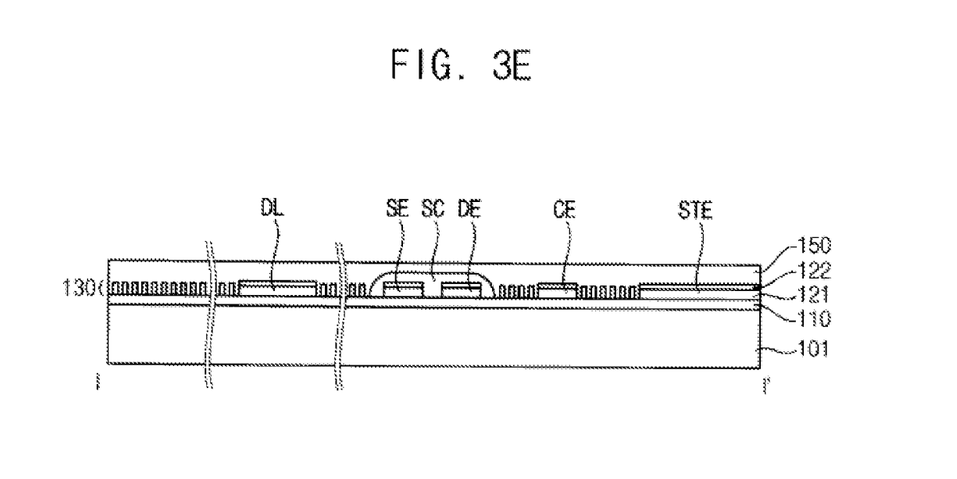

Referring to FIG. 3E, the gate insulation layer 150 is formed on the base substrate 101, on which the semiconductor pattern SC is formed. The gate insulation layer 150 may have a double-layered structure, and each of the layers may have a different material and a different forming process, according to some embodiments.

Figure 5A:
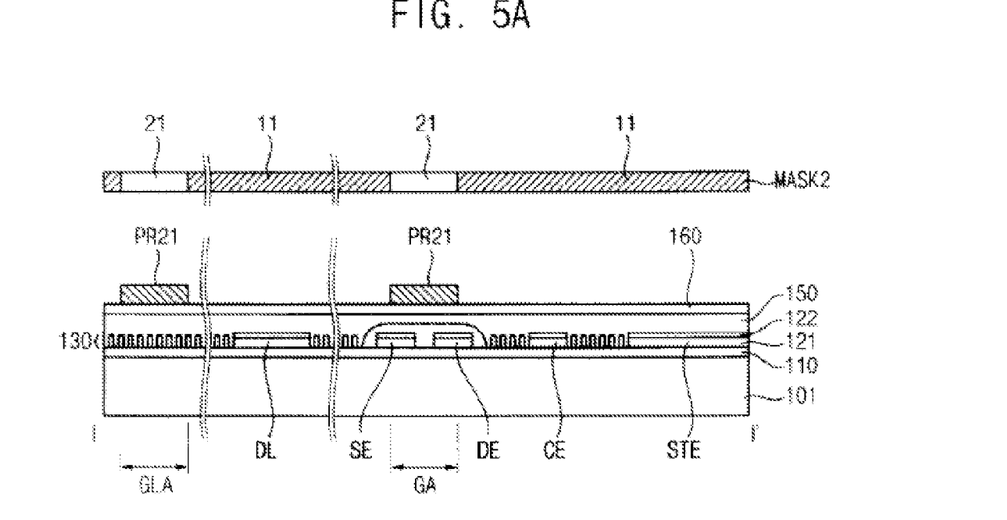
FIGS. 5A and 5B are cross-sectional views explaining a method of forming a second conductive pattern of FIG. 2.
Figure 5B:
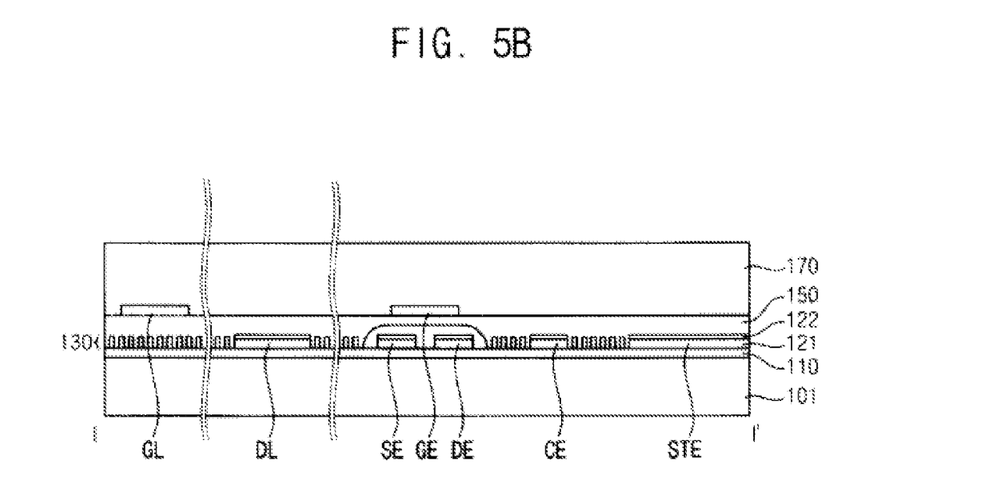

FIGS. 5A and 5B are cross-sectional views explaining a method of forming the second conductive pattern of FIG. 2. Referring to FIGS. 2 and 5A, a second conductive layer 160 is formed on the gate insulation layer 150. The second conductive layer 160 may include at least one of chromium (Cr), a chromium alloy, molybdenum (Mo), molybdenum nitride (MoN), molybdenum niobium (MoNb), a molybdenum alloy, copper (Cu), a copper alloy, a copper molybdenum (CuMo) alloy, aluminum (Al), an aluminum alloy, silver (Ag), and a silver alloy, so as to exhibit good wiring characteristics.

A photoresist film is formed on the second conductive layer 160. The photoresist film is patterned using a second mask MASK2. The second mask MASK2 includes a blocking portion 11 and an open portion 21. The photoresist film is patterned using the second mask MASK2, to form a photo pattern PR21. The photo pattern PR21 is formed in a gate line area GLA, in which the gate line GL is formed, and in a gate area GA, in which the gate electrode GE is formed. The second conductive layer 160 is patterned using the photo pattern PR21, to form the second conductive pattern including the gate line GL and the gate electrode GE.

Referring to FIGS. 2 and 5B, an organic insulation layer 170 is formed on the second conductive pattern and the gate insulation layer 150. The organic insulation layer 170 is relatively thick, so that a parasitic capacitance between the data line DL, gate line GL, and the switching element TR1, which are formed under the organic insulation layer 170, and the pixel electrode PE, which is formed on the organic insulation layer 170, may be low. Thus, the pixel electrode PE may be formed in a relatively large area. Accordingly, a display substrate having a high aperture ratio may be formed.

Figure 6:
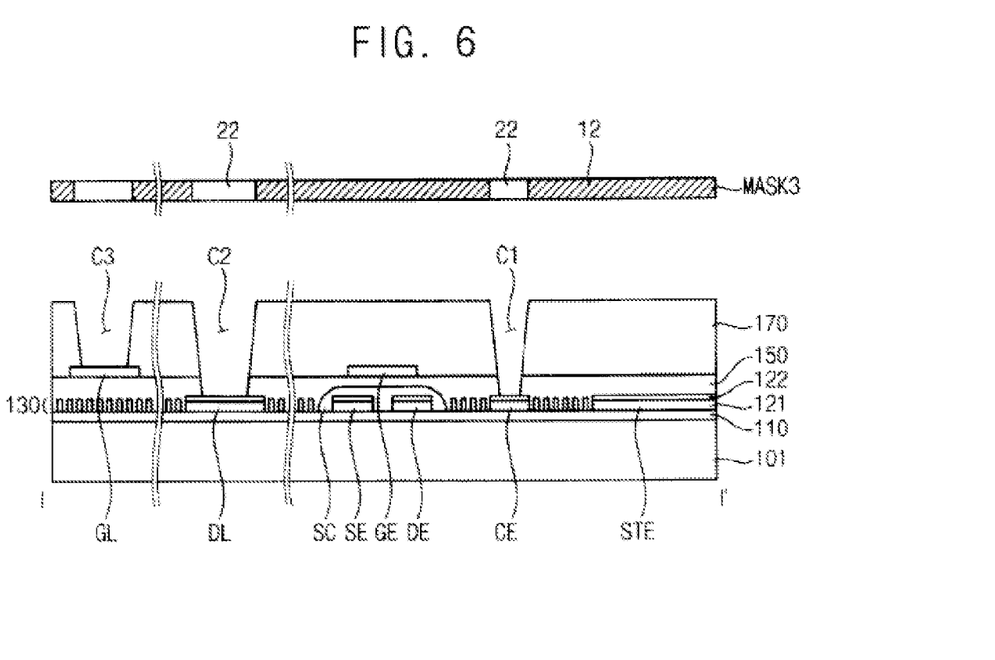
FIG. 6 is a cross-sectional view explaining a method of forming first, second, and third contact holes of FIG. 2.

FIG. 6 is a cross-sectional view explaining a method of forming the first, second, and third contact holes C1, C2, and C3 of FIG. 2. Referring to FIGS. 2 and 6, a third mask MASK3 is disposed over the organic insulation layer 170. The organic insulation layer 170 is etched using the third mask MASK3. The third mask MASK3 includes a blocking portion 12 and an open portion 22. The first contact hole C1 and the second contact hole C2 are formed in the organic insulation layer 170 and may also be formed in the gate insulating layer 150. The first contact hole C1 exposes the contact electrode CE, and the second contact hole C2 exposes an end portion of the data line DL. The third contact hole C3 is formed in the organic insulation layer 170, to expose an end portion of the gate line GL.

Figure 7:
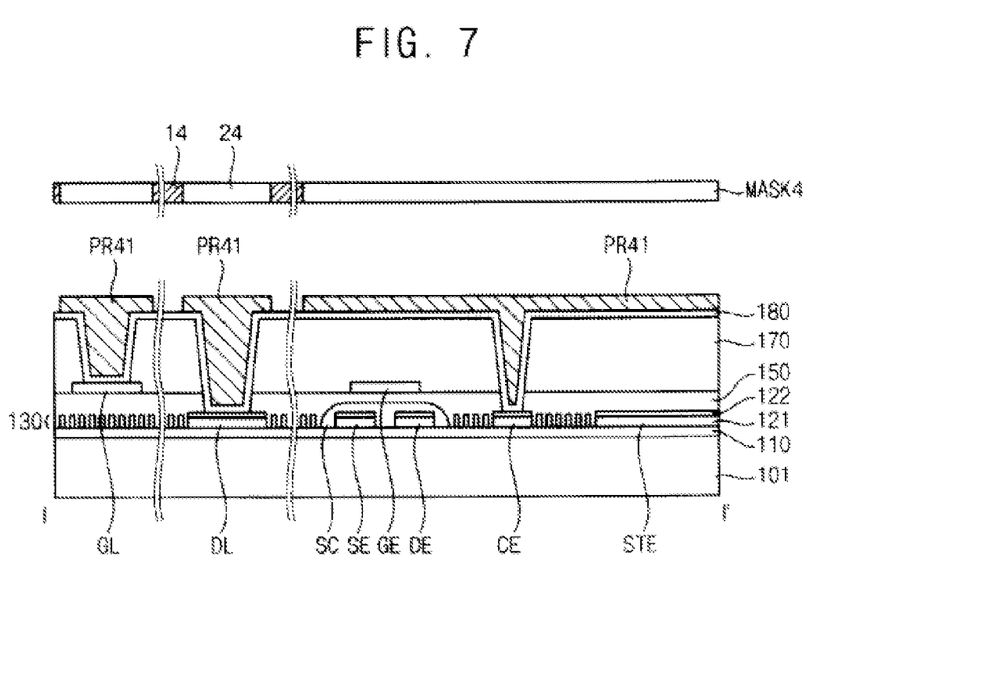
FIG. 7 is a cross-sectional view explaining a method of forming a pixel electrode of FIG. 2.

FIG. 7 is a cross-sectional view explaining a method of forming the pixel electrode PE illustrated in FIG. 2. Referring to FIGS. 2 and 7, a third conductive layer 180 is formed on the organic insulation layer 170 and in the first, second, and third contact holes C1, C2, and C3. The third conductive layer 180 may include a transparent conductive material or an opaque conductive material. For example, the third conductive layer 180 may include the transparent conductive material when the display substrate is a transmissive-type.

The material of the third conductive layer 180 may include the transparent conductive material or the opaque conductive material according to the type of an electro-optical layer, when the display substrate is a reflective-type. Thus, the third conductive layer 180 may include a transparent conductive material when the electro-optical layer is an electrophoretic layer, including a black conductive particles and white conductive particles.

A photoresist film is formed on the third conductive layer 180. The photoresist film is patterned using a fourth mask MASK4. To form a photo pattern PR41. The fourth mask MASK4 includes a blocking portion 14 and an open portion 24.

The photo pattern PR41 is formed in a pixel area, in which the pixel electrode PE is formed, in an area in which the data pad electrode DPE is formed, and in an area in which the gate pad electrode GPE is formed. The third conductive layer 180 is patterned using the photo pattern PR41, to form the pixel electrode PE, the data pad electrode DPE, and the gate pad electrode GPE.

According to the present exemplary embodiment, a semiconductor pattern including a soluble semiconductor material may be formed using a SAM, without a mask, so that a display substrate having a switching element with a top gate structure may be manufactured, via a four-mask process.

Figure 8:
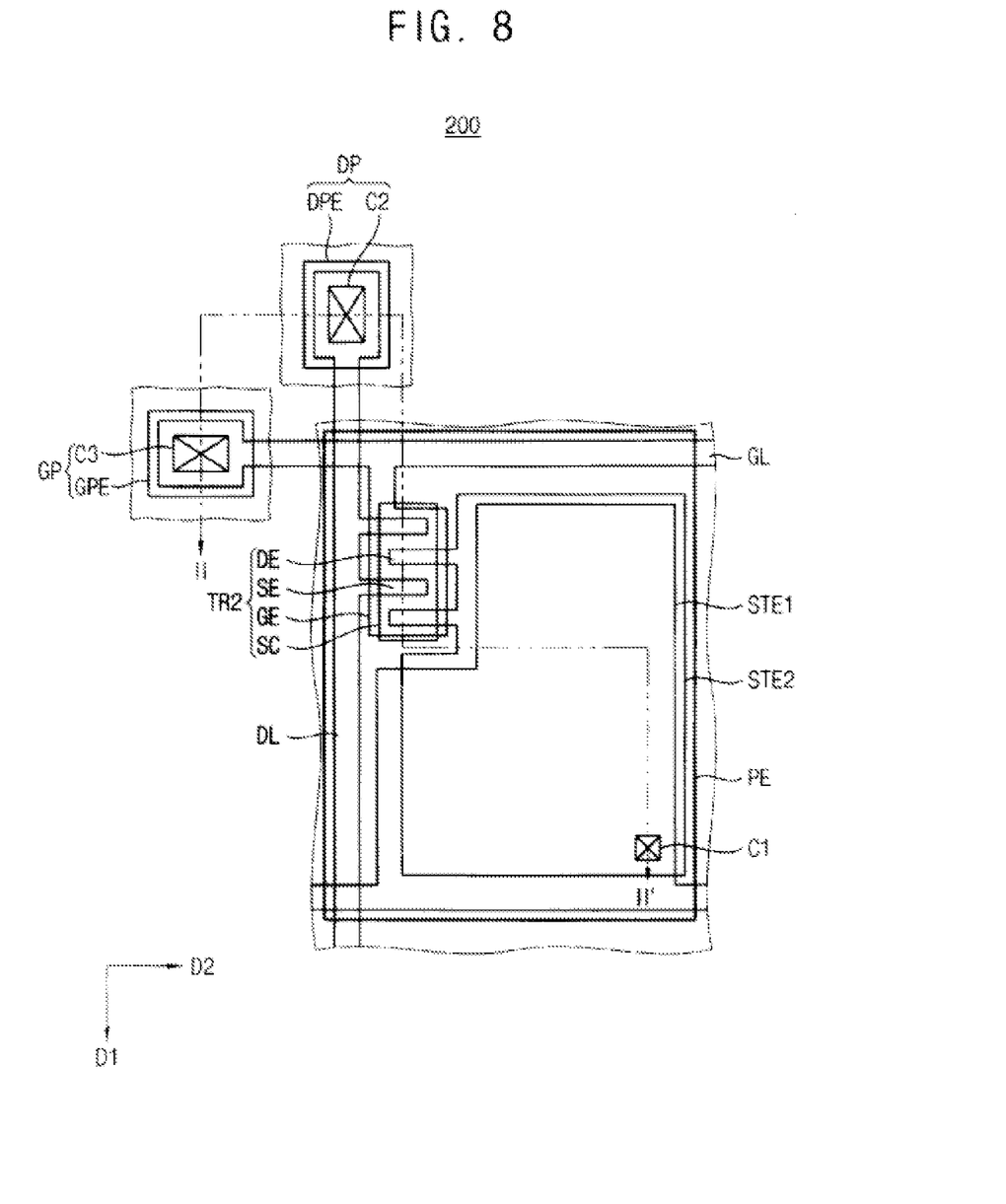
FIG. 8 is a plan view illustrating a display substrate, according to another exemplary embodiment of the present invention.
Figure 9:
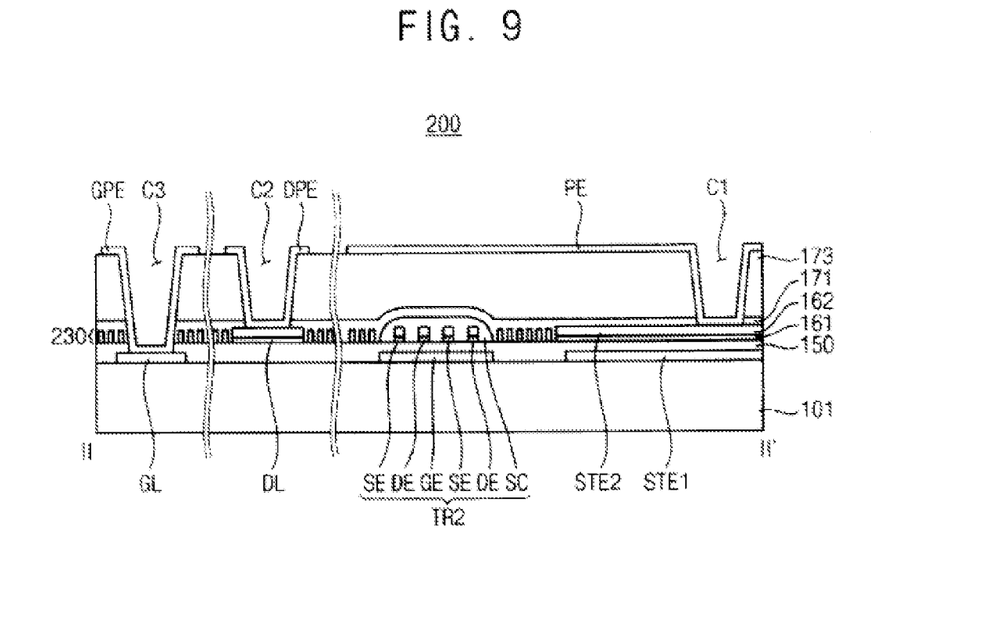
FIG. 9 is a cross-sectional view taken along line II-II' of FIG. 8.

FIG. 8 is a plan view illustrating a display substrate, according to another exemplary embodiment of the present disclosure. FIG. 9 is a cross-sectional view taken along line II-II' of FIG. 8. Hereinafter, the same reference numerals will be used to refer to the same or like parts as described in FIG. 2, and a further repetitive explanation concerning the above elements will be omitted.

Referring to FIGS. 8 and 9, the display substrate includes a base substrate 101, a gate line GL, a data line DL, a pixel electrode PE, a first storage electrode STE1, a second storage electrode STE2, a switching element TR2, a data pad DP, and a gate pad GP. The display substrate further includes a gate insulation layer 150, a SAM 230, a protection layer 171 and an organic insulation layer 173.

The base substrate 101 may include a glass substrate or a flexible substrate. The gate line GL may be referred to as a first conductive pattern and extends along a second direction D2. The gate line GL may include a plurality of parallel gate lines GL.

The data line DL may be referred to as a second conductive pattern and extends in a first direction D1, across the gate line GL. The data line DL may include a plurality of parallel data lines DL. The second conductive pattern includes a first metal layer 161 and a second metal layer 162. The first metal layer 161 and the second metal layer 162 may be formed of the same materials as the first metal layer 121 and the second metal layer 122, respectively.

The pixel electrode PE may be referred to as a third conductive pattern and includes a transparent conductive material or an opaque conductive material. The pixel electrode PE is disposed in a pixel area of the base substrate 101. The pixel electrode PE may include the same materials as the pixel electrode PE of FIG. 2.

The first storage electrode STE1 is included in the first conductive pattern and faces the pixel electrode PE. In the present exemplary embodiment, a reflective type display substrate is explained, and thus, the first storage electrode STE1 may be formed below most of the pixel electrode PE. Alternatively, in a transparent display substrate, the first storage electrode STE1 may be formed below a smaller portion of the pixel electrode PE, to improve light extraction.

The second storage electrode STE2 is included in the second conductive pattern and is disposed in an area overlapping the pixel area. The second storage electrode STE2 is connected to the pixel electrode PE, through a first contact hole C1.

The switching element TR2 includes a gate electrode GE, a source electrode SE, a drain electrode DE, and a semiconductor pattern. The gate electrode GE, which is included in the first conductive pattern, is connected to the gate line GL. The drain electrode DE, which is included in the second conductive pattern, is spaced apart from the source electrode SE and connected to the second storage electrode STE2. The semiconductor pattern SC covers the source and drain electrodes SE and DE. The switching element TR2 has a bottom gate structure. In the bottom gate structure, the gate electrode GE is disposed under the semiconductor pattern SC.

The gate insulation layer 150 covers the first conductive pattern GL, GE, and STE1. The SAM 230 is formed on the gate insulation layer 150, between the second conductive pattern (DL, SE, DE, and STE2) and the semiconductor pattern SC.

The protection layer 171 covers the semiconductor pattern SC. The organic insulation layer 173 covers the second conductive pattern (DL, SE, DE, and STE2) and the SAM 230. The organic insulation layer 173 may be formed as a relatively thick layer, to provide a high aperture ratio structure.

Figure 10:
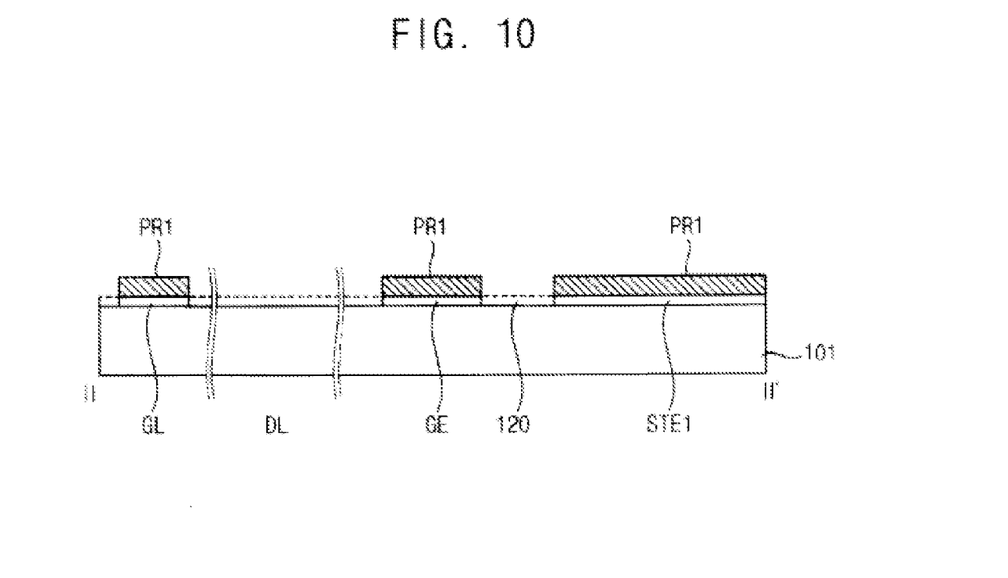
FIG. 10 is a cross-sectional view explaining a method of forming a first conductive pattern of FIG. 9.

FIG. 10 is a cross-sectional view explaining a method of forming the first conductive pattern of FIG. 9. Referring to FIGS. 9 and 10, a first conductive layer 120 is formed on a base substrate 101. A photoresist film is formed on the first conductive layer 120. The photoresist film is patterned using a first mask to form the photo pattern PR1. The first conductive layer 120 is patterned using the photo pattern PR1, to form the first conductive pattern. The first conductive pattern includes the gate line GL, the gate electrode GE, and the first storage electrode STE1.

Figure 11A:
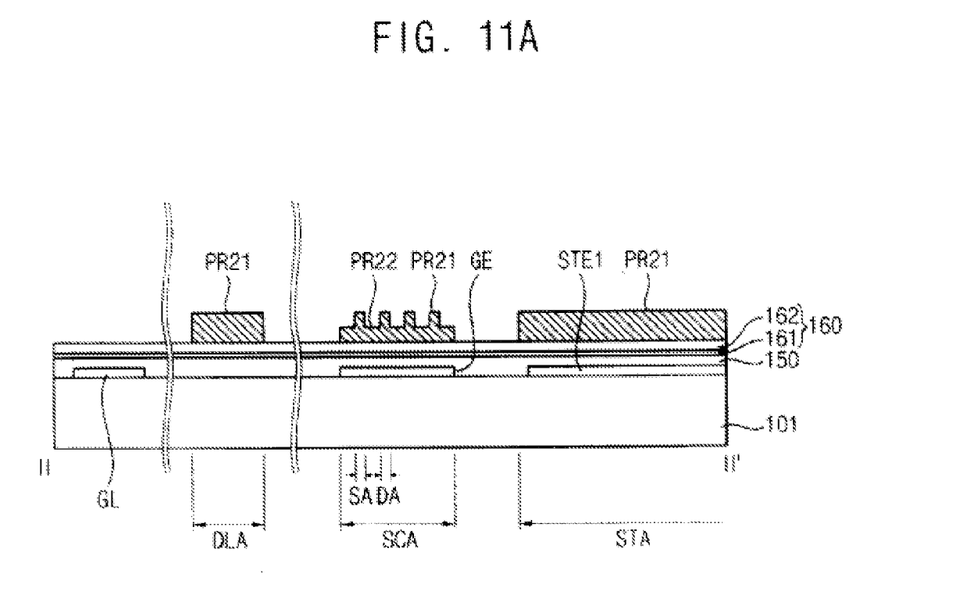
FIGS. 11A, 11B, and 11C are cross-sectional views explaining a method of forming a second conductive pattern and a semiconductor pattern of FIG. 9.
Figure 11B:
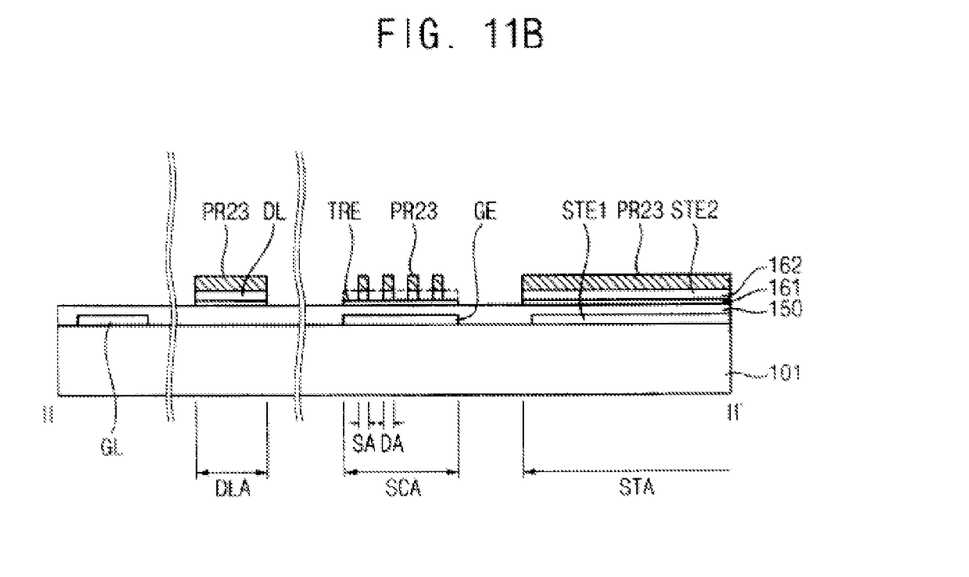
Figure 11C:
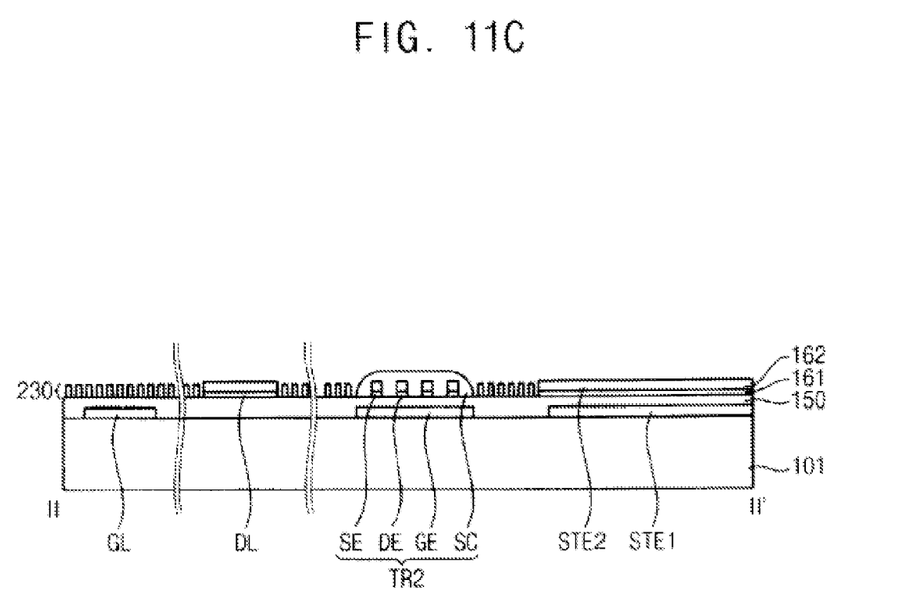
Figure 12:
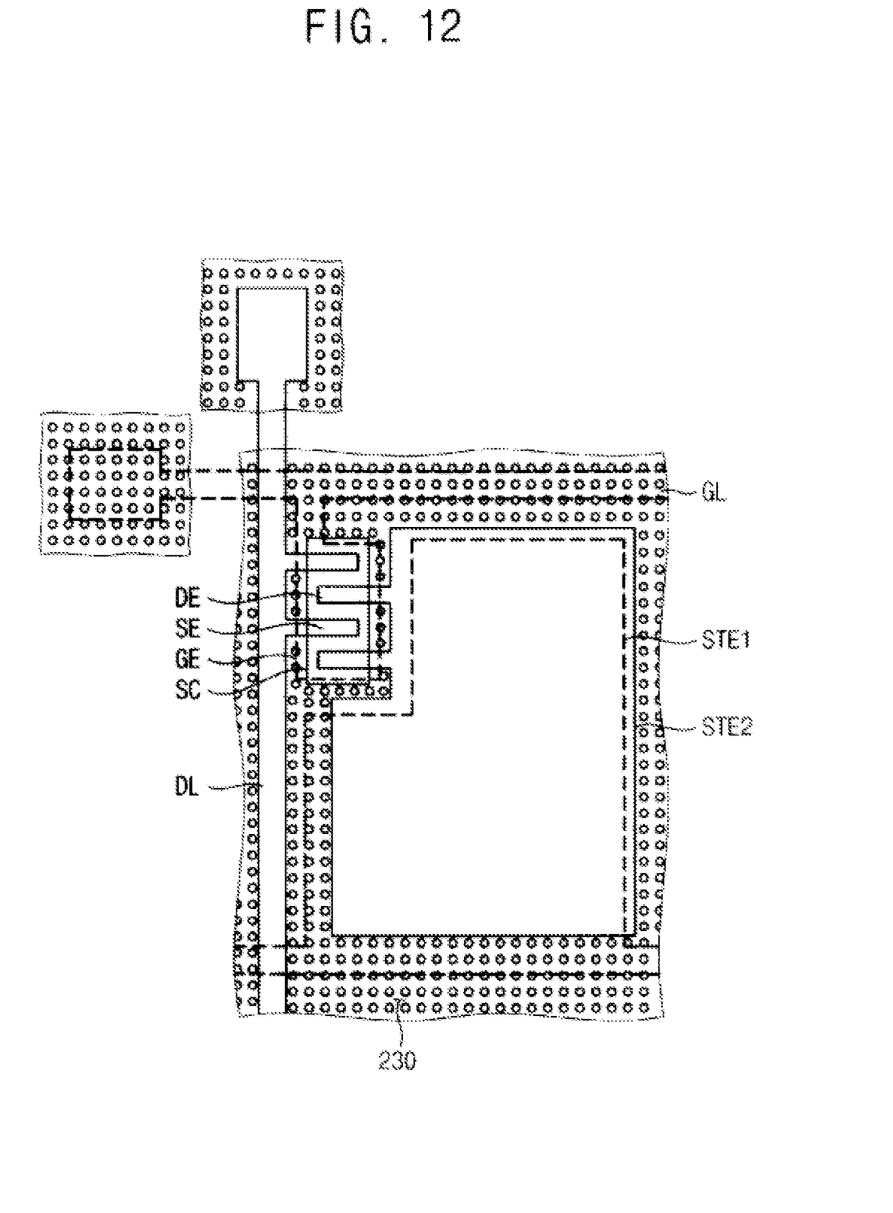
FIG. 12 is a plan view illustrating the second conductive pattern and the semiconductor pattern of FIG. 10.

FIGS. 11A, 11B, and 11C are cross-sectional views explaining a method of forming the second conductive pattern and a semiconductor pattern of FIG. 9. FIG. 12 is a plan view illustrating the substrate on which the second conductive pattern and the semiconductor pattern SC of FIG. 10.

Referring to FIGS. 9 and 11A, the gate insulation layer 150 is formed on the first conductive pattern. Then, a second conductive layer 160, including a first metal layer 161 and a second metal layer 162, is formed on the gate insulation layer 150. The first metal layer 161 and the second metal layer 162 may include the same materials as the first conductive layer 121 and the second conductive layer 122, respectively.

A photoresist film is formed on the second conductive layer 160. A first photo pattern PR21 having a first thickness and a second photo pattern PR22 having a second thickness thinner than the first thickness are formed by patterning the film using a second mask MASK2. The second mask MASK2 includes an open portion 20 and a slit portion 30. The first photo pattern PR21 is formed due to the open portion 20, and the second photo pattern PR22 is formed due to the slit portion 30.

The first photo pattern PR21 is formed on a data line area DLA, in which the data line DL is formed and on the storage area STA, in which the storage electrode STE2 is formed. The first photo pattern PR21 and the second photo pattern PR22 are formed in a semiconductor area SCA, in which the semiconductor pattern SC is formed.

The first photo pattern PR21 covers the source and drain electrodes SE and DE. The second photo pattern PR22 is formed between portions of the first photo pattern PR21. The second conductive layer 160 is patterned using the first and second photo patterns PR21 and PR22.

Referring to FIGS. 9 and 11B, the second conductive layer 160 is patterned to form the second conductive pattern, including the data line DL, the second storage electrode STE2, and the switching electrode TRE. An etch back process is performed to remove second photo pattern PR22 and form a third photo pattern PR23 having a third thickness, by reducing the thickness of the first photo pattern PR21. The third photo pattern PR23 is formed on the data line area DLA, on the source and drain areas SA and DA, and on the storage area STA. The second metal layer 162 is exposed in portions except for the source and drain areas SA and DA of the switching electrode TRE by the third photo pattern PR23.

Then, the expose portions of the second metal layer 162 are etched using the third photo pattern PR23. Accordingly, a switching electrode TRE including the first metal layer 161 and the second metal layer 162 is formed in the semiconductor area SCA.

Referring to FIGS. 11C and 12, the SAM 230 is formed on exposed portions of the gate insulation layer 150, using the second conductive pattern as a mask. The SAM 230 is not formed on portions of the insulation layer 150 covered by the second conductive pattern.

The first metal layer 161 on the switching electrode TRE is patterned, using the second metal layer 162 as a mask, to form the source electrode SE and the drain electrode DE of the switching element TR2. The source and drain electrodes SE and DE are formed in the source and drain areas SA and DA of the semiconductor area SCA. The gate insulation layer 150 is exposed in a remaining portion of the semiconductor area.

A soluble semiconductor material is applied to the resultant, by an inkjet dropping method, for example. The soluble semiconductor material is condensed into the semiconductor area SCA, by the SAM 230 adjacent thereto, and forms the semiconductor pattern SC. The soluble semiconductor material is as described above, with regard to FIG. 3C.

Figure 13:
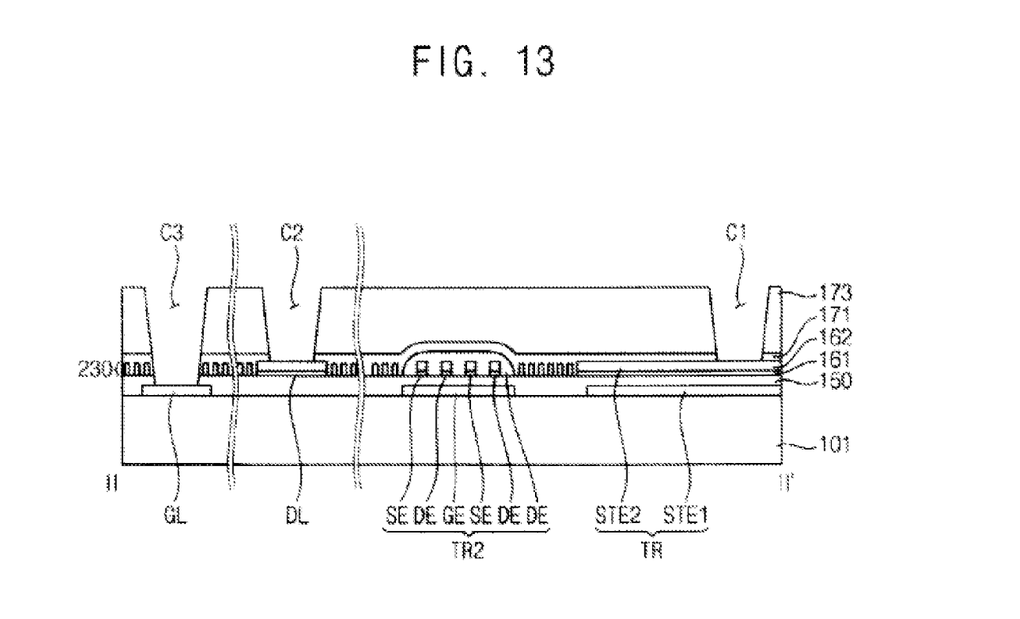
FIG. 13 is a cross-sectional view explaining a method of forming first, second, and third contact holes of FIG. 9.

FIG. 13 is a cross-sectional view explaining a method of forming the first, second, and third contact holes C1, C2, and C3 of FIG. 9. Referring to FIGS. 9 and 13, a protection layer 171 is formed on the semiconductor pattern SC.

The protection layer 171 may include silicon oxide ($SiO_x$) and/or silicon nitride ($SiN_x$). The protection layer 171 protects the semiconductor pattern SC. The organic insulation layer 173 is formed on the protection layer 171. Then, the organic insulation layer 173 is etched using a third mask, to form the first, second, and third contact holes C1, C2, and C3. The first contact hole C1 exposes the second storage electrode STE2, the second contact hole C2 exposes an end portion of the data line DL, and the third contact hole C3 exposes an end portion of the gate line GL.

Figure 14:
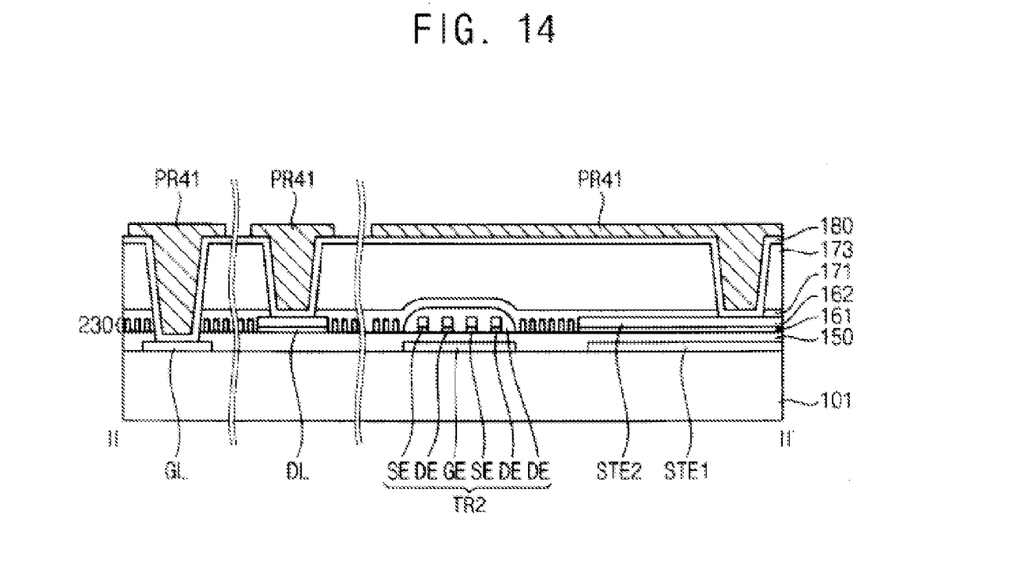
FIG. 14 is a cross-sectional view explaining a method of forming a pixel electrode of FIG. 9.

FIG. 14 is a cross-sectional view explaining a method of forming the pixel electrode PE illustrated in FIG. 9. Referring to FIGS. 9 and 14, a third conductive layer 180 is formed on the organic insulation layer 173 and in the first, second and third contact holes C1, C2 and C3. The third conductive layer 180 may include a transparent conductive material or an opaque conductive material, as recited above, with regard to the third conductive layer 180 of FIG. 7.

A photoresist film is formed on the third conductive layer 180. The photoresist film is patterned using a fourth mask MASK4, to form a photo pattern PR41. The photo pattern PR41 is formed in a pixel area in which the pixel electrode PE is formed, in an area in which the data pad electrode DPE is formed, and in an area in which the gate pad electrode GPE is formed. The third conductive layer 180 is patterned using the photo pattern PR41 to form the pixel electrode PE, the data pad electrode DPE, and the gate pad electrode GPE.

According to the present exemplary embodiment, a semiconductor pattern including a soluble semiconductor material may be used to form a SAM, without the use of a mask. As such, a display substrate having a switching element with a bottom gate structure may be manufactured, via a four-mask process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display substrate comprising:
a base substrate;
a conductive pattern comprising a data line formed on the base substrate and extending along a first direction;
a gate line disposed on the base substrate and extending along a second direction crossing the first direction;

a switching element comprising:
- a source electrode electrically connected to the data line;
- a drain electrode spaced apart from the source electrode;
- a semiconductor pattern covering the source and drain electrodes; and
- a gate electrode electrically connected to the gate line and facing the semiconductor pattern;

a self-assembled monolayer (SAM) disposed on an insulating layer near the semiconductor pattern and the conductive pattern, but not on the semiconductor pattern and the conductive pattern; and a pixel electrode disposed on the base substrate and electrically connected to the switching element.

2. The display substrate of claim 1, wherein the conductive pattern comprises a first metal layer and a second metal layer disposed on the first metal layer.

3. The display substrate of claim 1, wherein the gate electrode is disposed between the semiconductor pattern and the pixel electrode.

4. The display substrate of claim 3, further comprising an insulation layer disposed between the base substrate and the semiconductor pattern.

5. The display substrate of claim 3, further comprising an organic insulation layer disposed between the gate electrode and the pixel electrode.

6. The display substrate of claim 3, wherein the conductive pattern further comprises a storage electrode facing the pixel electrode.

7. The display substrate of claim 1, wherein the semiconductor pattern is disposed between the gate electrode and the pixel electrode.

8. The display substrate of claim 7, further comprising:
- a protection layer disposed on the semiconductor pattern; and
- an organic insulation layer disposed between the protection layer and the pixel electrode.

9. The display substrate of claim 8, further comprising a first storage electrode facing the pixel electrode.

10. The display substrate of claim 9, wherein:
- the conductive pattern is electrically connected to the pixel electrode, and
- the conductive pattern further comprises a second storage electrode facing the first storage electrode.

* * * * *